(12) United States Patent
Tu

(10) Patent No.: US 11,749,593 B2
(45) Date of Patent: Sep. 5, 2023

(54) ELECTRONIC STRUCTURE, ELECTRONIC PACKAGE STRUCTURE AND METHOD OF MANUFACTURING ELECTRONIC DEVICE

(71) Applicant: Advanced Semiconductor Engineering, Inc., Kaohsiung (TW)

(72) Inventor: Shun-Tsat Tu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 98 days.

(21) Appl. No.: 17/378,511

(22) Filed: Jul. 16, 2021

(65) Prior Publication Data

US 2023/0018762 A1 Jan. 19, 2023

(51) Int. Cl.
*H01L 21/48* (2006.01)
*H01L 23/498* (2006.01)
*H01L 23/00* (2006.01)
*H01L 25/00* (2006.01)

(52) U.S. Cl.
CPC .... *H01L 23/49833* (2013.01); *H01L 21/4814* (2013.01); *H01L 23/49811* (2013.01); *H01L 24/16* (2013.01); *H01L 24/48* (2013.01); *H01L 24/85* (2013.01); *H01L 25/50* (2013.01); *H01L 24/73* (2013.01); *H01L 2224/16145* (2013.01); *H01L 2224/16227* (2013.01); *H01L 2224/48227* (2013.01); *H01L 2224/73265* (2013.01)

(58) Field of Classification Search
CPC ........... H01L 23/49833; H01L 21/4814; H01L 23/49811; H01L 24/16; H01L 24/48; H01L 24/85; H01L 25/50; H01L 24/73; H01L 2224/16145; H01L 2224/16227; H01L 2224/48227; H01L 2224/73265
See application file for complete search history.

(56) References Cited

U.S. PATENT DOCUMENTS

2016/0260695 A1* 9/2016 Chung .................... H01L 25/50

* cited by examiner

*Primary Examiner* — Elias Ullah
(74) *Attorney, Agent, or Firm* — FOLEY & LARDNER LLP

(57) ABSTRACT

An electronic structure, an electronic package structure and method of manufacturing an electronic device are provided. The electronic structure includes a carrier and a protection layer. The carrier includes a first pad, a second pad and a first dielectric layer. The first pad is at a side of the carrier and configured to bond with a conductive pad. The second pad is at the side of carrier and configured to electrically connect an exterior circuit. The first dielectric layer includes a first portion around the first pad and a second portion around the second pad, wherein a top surface of the first portion and a top surface of the second portion are substantially coplanar. The protection layer is on the second pad and covers the second pad.

6 Claims, 22 Drawing Sheets

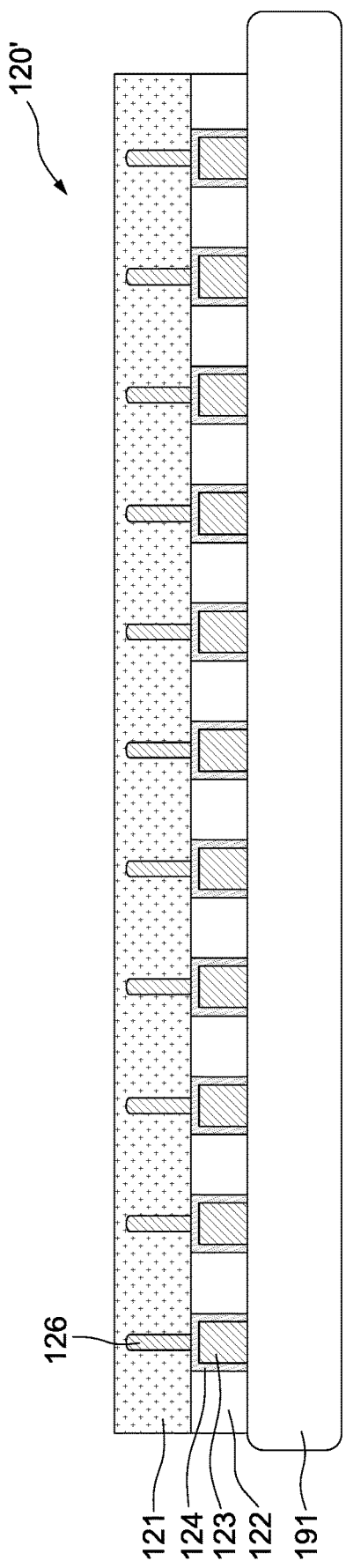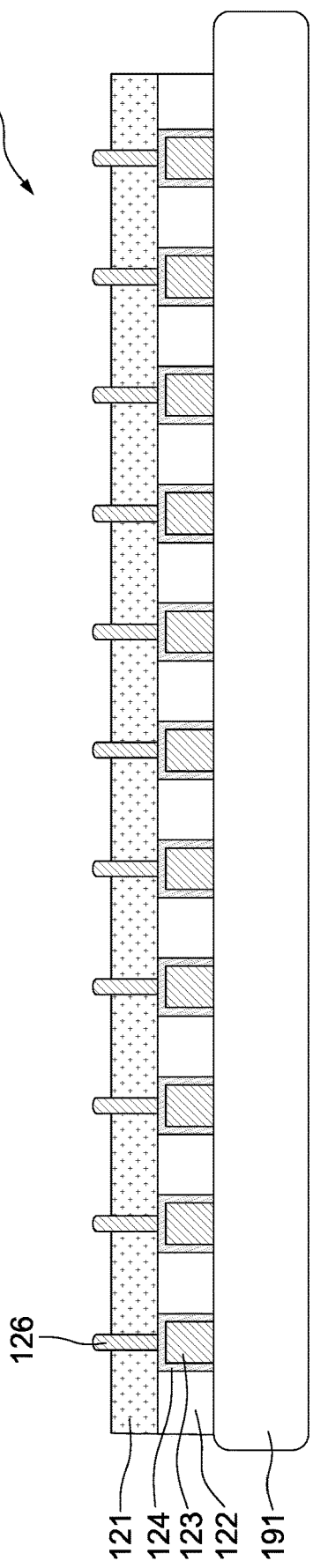
FIG. 7A
FIG. 7B

ELECTRONIC STRUCTURE, ELECTRONIC PACKAGE STRUCTURE AND METHOD OF MANUFACTURING ELECTRONIC DEVICE

BACKGROUND

1. Field of the Disclosure

The present disclosure relates to an electronic structure, in particularly to an electronic structure with a protection layer on a conductive pad.

2. Description of the Related Art

When two dies of different sizes are hybrid-bonded, a portion of input/output (I/O) terminals on the larger die are exposed from the smaller die. Normally the exposed I/O terminals are prone to be oxidized by virtue of direct exposure to ambient environment, and subsequently causing penalty in bonding capability with the conductive wires or bumps. The problem set forth can often be observed in die-to-wafer or chip-to-wafer packages.

SUMMARY

In some embodiments, an electronic structure includes a carrier. The carrier includes a first pad, a second pad, a first dielectric layer, and a protection layer. The first pad is at a side of the carrier and configured to bond with a conductive pad. The second pad is at the side of carrier and configured to electrically connect an exterior circuit. The first dielectric layer includes a first portion around the first pad and a second portion around the second pad, wherein a top surface of the first portion and a top surface of the second portion are substantially coplanar. The protection layer is on the second pad and covers the second pad.

In some embodiments, an electronic package structure includes a carrier and a component disposed on the carrier. The carrier includes a pad, a dielectric layer, and a protection layer. The pad is at a side of the carrier and configured to electrically connect an exterior circuit. The dielectric layer is around the pad. The protection layer is on the pad and covers the pad and the dielectric layer. The component is disposed on the side of the carrier. A top surface of the component is higher than a top surface of the pad.

In some embodiments, a method of manufacturing an electronic device includes: (a) providing a first component comprising a first pad and a second pad at a same side of the first component; (b) surface-treating the first pad and the second pad; (c) connecting a second component to the first component through the first pad; and (d) forming a protection layer on the second pad.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 7A, FIG. 7B, FIG. 7C, FIG. 7D, FIG. 7E, FIG. 7F, FIG. 7G, FIG. 7H and FIG. 7I illustrate various stages of an example of a method for manufacturing an electronic package structure according to some embodiments of the present disclosure.

DETAILED DESCRIPTION

Figure 1A:
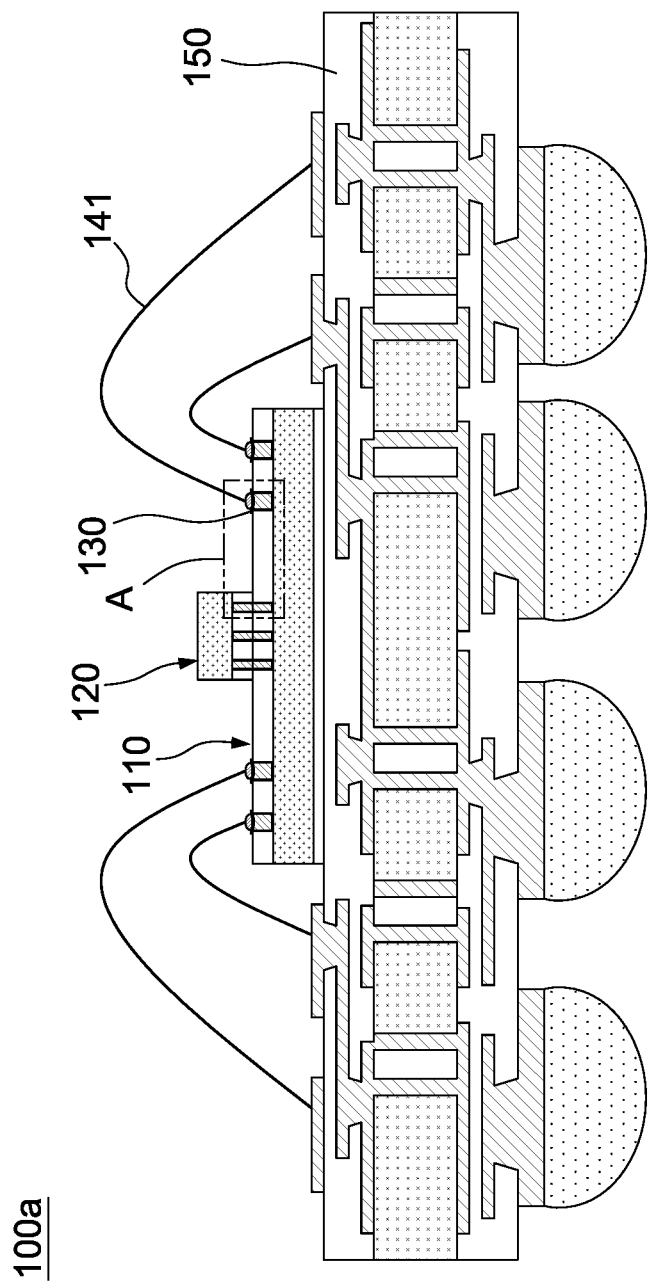
FIG. 1A is a cross-sectional view of an example of an electronic package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some embodiments, the hybrid-bonded packages of different die sizes face a common problem that the external contact pads are exposed from a smaller die serving as a morphology modifier. The exposed external contact pads are prone to be oxidized or damaged by virtue of direct exposure to ambient environment, and subsequently causing penalty in bonding capability with the conductive wires or bumps. In some embodiments, a protection layer is electroplated to cover said external contact pads. The smaller die prevents a continuous conductive layer (e.g., a seed layer for electroplating operations) from forming over the entire surface profile of said hybrid-bonded packages. The continuous conductive layer intended to be formed may follow a subsequent lithography patterning operation, covering the portion of the external contact pads (e.g., I/O terminals) on the larger die, and serving as a protection layer to delay or prevent the aforesaid I/O terminals from oxidation, thereby facilitating the subsequent conductive wire bonding operation.

When the smaller die, or the morphology modifier, possesses a thickness greater than about 30 such package morphology exacerbates the problem of forming a continuous conductive layer over said package using a conventional electroplating operation because a layer discontinuation is prone to occur when depositing (e.g., sputtering) a seed layer prior to the electroplating operation. Consequently, an electroplated conductive layer with uneven thickness may be obtained. Furthermore, the smaller die creating the abrupt morphology also increases the difficulty of planarizing a photoresist layer in the subsequent photolithography operation for patterning such electroplated conductive layer. In some embodiments, forming a sufficiently thick electroplated conductive layer may mitigate the aforesaid conductive layer discontinuity problem. In some other embodiment, using electroless plating operations, such as chemical plating operations, may avoid the aforesaid conductive layer discontinuity problem.

FIG. 1A is a cross-sectional view of an example of an electronic package structure 100a according to some embodiments of the present disclosure.

In some embodiments, the electronic package structure 100a may include an electronic component 110, a morphology modifier 120, conductive caps 130, electrical connectors 141, and a carrier 150. In some embodiments, the electronic package structure 100a is a semiconductor package structure.

The electronic component 110 may include active components and/or passive components. The active component may include a semiconductor die or a chip, such as a logic die (e.g., application processor (AP), system-on-a-chip (SoC), central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components. In some embodiments, the electronic component 110 may include a plurality of transistors, diodes, or other active components. The transistor may include bipolar junction transistor, MOSFET, JFET or other transistors. The diode may include Zener diode, photodiode, Schottky diode or other diodes. The passive component may include a capacitor, inductor, resistor, filter, diplexer, balun, or a combination of such components. In some embodiments, the electronic component 110 may include a wafer and have active components and/or passive components formed therein. In some embodiments, the electronic component 110 may also be referred to a carrier or a component.

The morphology modifier 120 may be disposed on the electronic component 110. In some embodiments, the morphology modifier 120 can be an object modifying the surface morphology of the electronic component 110 or even the morphology of the carrier 150. The morphology modifier 120 may protrude from a top surface of the electronic component 110. In some embodiments, the morphology modifier 120 may be directly bonded to the electronic component 110. The morphology modifier 120 may be electrically connected to the electronic component 110. In some embodiments, the morphology modifier 120 may include an electronic component. The morphology modifier 120 may include active components and/or passive components. In some embodiments, the morphology modifier 120 may include a semiconductor die or a chip. In some embodiments, the morphology modifier 120 may be hybrid bonded to the electronic component 110. In some embodiments, the morphology modifier 120 may have a thickness greater than or equal to about 30 μm, such as 30 μm, 40 μm, 50 μm, 60 μm, 70 μm, 80 μm, 90 μm or 100 μm. In some embodiments, when the morphology modifier 120 is a semiconductor die with a die size smaller than that of the electronic component 110, the thickness of the electronic component 110 is greater than a thickness of the morphology modifier 120. In some embodiments, the morphology modifier 120 may also be referred to a carrier.

The conductive cap 130 (or a protection layer) may be disposed on the electronic component 110. In some embodiments, the conductive cap 130 may be exposed from the morphology modifier 120. In some embodiments, the conductive cap 130 may be exposed from the morphology modifier 120. The conductive cap 130 may be configured to electrically connect the electronic component 110 and the electrical connector 141, and protect terminals (shown in FIG. 1B) of the electronic component 110 from forming undesired side products (such as metal oxide) during a manufacturing process. The conductive cap 130 may include electrically conductive material, such as copper, gold, tin, aluminum, silver, tungsten, nickel, or a combination thereof.

The electrical connector 141 may be disposed on the conductive cap 130. The electrical connector 141 may be configured to electrically connect the electronic component 110 and the carrier 150. The electrical connector 141 may form an external connection from the electronic component 110. In some embodiments, the electrical connector 141 may include a bonding wire. The electrical connector 141 may include electrically conductive material, such as copper, gold, tin, aluminum, silver, tungsten, nickel, or a combination thereof.

The carrier 150 (or an exterior circuit) may be configured to electrically connect the electronic component 110 and/or the morphology modifier 120 to other electronic components (not shown). The carrier 150 may include a printed circuit board, such as a paper-based copper foil laminate, a composite copper foil laminate, or a polymer-impregnated glass-fiber-based copper foil laminate. The carrier 150 may include a redistribution layer (RDL) or traces for electrical connection between different components. The carrier 150 can be replaced by other suitable carriers, such as a lead frame. A backside surface of the electronic component 110 may be disposed on the carrier 150 through a die attach film. The carrier 150 may have a plurality of terminals in contact with the electrical connector 141.

Figure 1B:
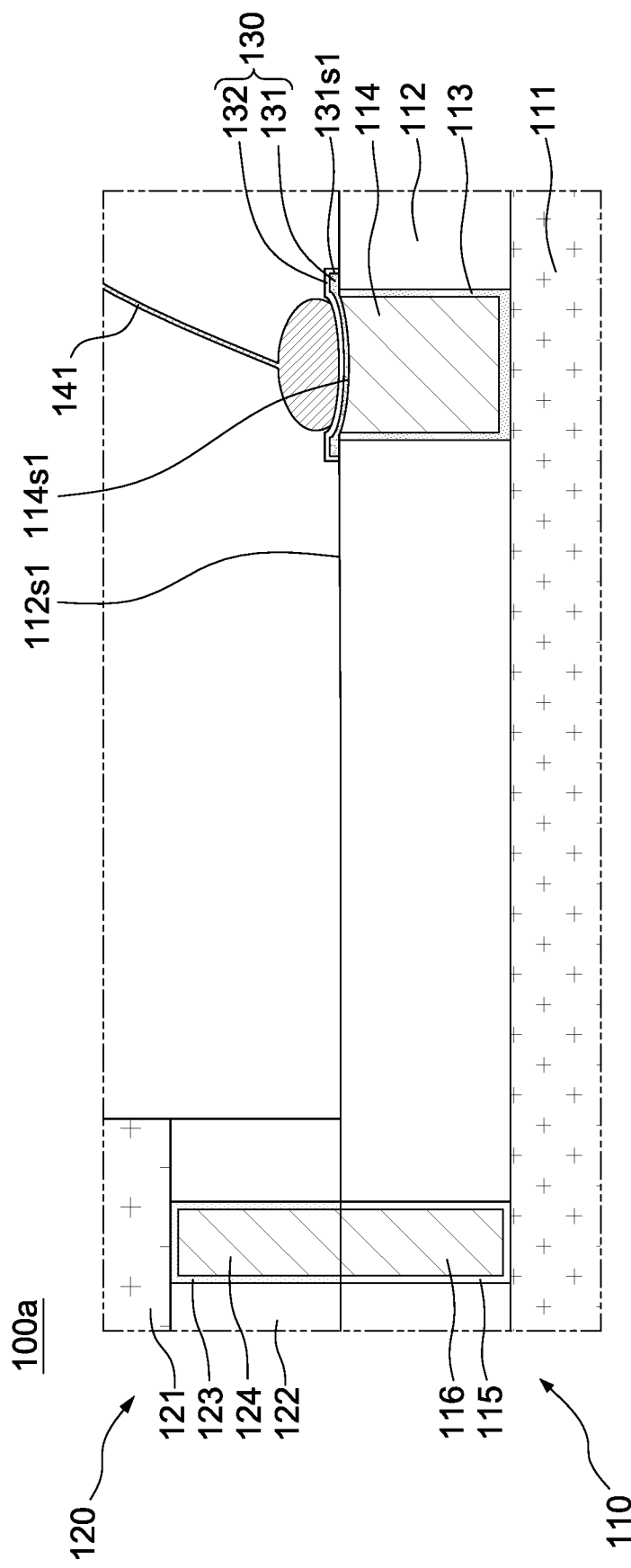
FIG. 1B is an enlarged view of region A of the electronic package structure as shown in FIG. 1A, according to some embodiments of the present disclosure.

FIG. 1B is an enlarged view of region A of the electronic package structure 100a as shown in FIG. 1A, according to some embodiments of the present disclosure.

The electronic component 110 may include a substrate 111, a dielectric layer 112, a seed layer 113, a terminal 114, a seed layer 115, and a conductive via 116.

The substrate 111 may be a semiconductor substrate. The substrate 111 may include silicon or germanium in a single crystal form, a polycrystalline form, or an amorphous form.

The dielectric layer 112 (or a bottom dielectric) may be disposed on the substrate 111. The dielectric layer 112 may include oxide, nitride, oxynitride, or other suitable materials. The dielectric layer 112 may define a plurality of openings for accommodating the seed layer 113, the terminal 114, the seed layer 115, and the conductive via 116.

The seed layer 113 may be disposed within the opening defined by the dielectric layer 112. The seed layer 113 may be disposed between the dielectric layer 112 and the terminal 114. The seed layer 113 may be disposed on the sidewall of the terminal 114. The seed layer 113 may include conductive materials, such as metal, metal oxide, metal nitride or other suitable materials.

The terminal 114 (or an external contact pad or a pad) may be disposed within the openings defined by the dielectric layer 112 and surrounded by or around the seed layer 113 and the dielectric layer 112. In some embodiments, the terminal 114 is configured to connect the carrier 150. In some embodiments, the terminal 114 may be exposed from the morphology modifier 120. In some embodiments, the terminal 114 may be exposed from the morphology modifier 120. The terminal 114 may include conductive materials, such as copper, gold, tin, aluminum, silver, tungsten, nickel, or a combination thereof. In some embodiments, the material of the terminal 114 may be different from the seed layer 113. The terminal 114 has a surface 114s1 (or a top surface). In some embodiments, the surface 114s1 is concave from a surface 112s1 (or a top surface) of the dielectric layer 112. In some embodiments, the surface 114s1 of the terminal 114 may include a dishing structure. In some embodiments, the distance between the lowest point and the edge of the surface 114s1 may range from about 5 nm to about 100 nm. The terminal 114 may also be referred to an outer I/O.

The seed layer 115 may be disposed within the openings defined by the dielectric layer 112. The seed layer 115 may be disposed between the conductive via 116 and the dielectric layer 112. The material of the seed layer 115 may be the same as or similar to that of the seed layer 113.

The conductive via 116 (or a bottom bond pad or a pad) may be disposed within the openings defined by the dielectric layer 112 and surrounded by or around the seed layer 115 and the dielectric layer 112. The material of the conductive via 116 may be the same as or similar to that of the terminal 114. The conductive via 116 may be configured to electrically connect the morphology modifier 120. The conductive via 116 may be covered by the morphology modifier 120. The conductive via 116 may also be referred to an inner I/O.

The morphology modifier 120 may include a substrate 121, a dielectric layer 122, a seed layer 123, and a conductive via 124. In some embodiments, the morphology modifier 120 is hybrid bonded to the electronic component 110. For example, the morphology modifier 120 is bonded to the electronic component 110 through binding the dielectric layer 122 of the morphology modifier 120 to the dielectric layer 112 of the electronic component 110 as well as through binding the conductive via 124 of the morphology modifier 120 to the conductive via 116 of the electronic component 110. The morphology modifier 120 may have a top surface (not shown) higher than that of the terminal 114. In some embodiments, a distance between the top surface of the morphology modifier 120 and the surface 112s1 of the dielectric layer 112 is greater than or equal to about 30 μm.

The substrate 121 may include a semiconductor substrate. The substrate 121 may include silicon or germanium in a single crystal form, a polycrystalline form, or an amorphous form.

The dielectric layer 122 (or a top dielectric) may be disposed on the substrate 121. The dielectric layer 122 may include oxide, nitride, oxynitride, or other suitable materials. The dielectric layer 122 may define a plurality of openings for accommodating the seed layer 123 and the conductive via 124. In some embodiments, the dielectric layer 122 of the morphology modifier 120 is in contact with the dielectric layer 112 of the electronic component 110.

The seed layer 123 may be disposed within the openings defined by the dielectric layer 122. The seed layer 123 may be disposed between the dielectric layer 122 and the conductive via 124. The seed layer 123 may include conductive materials, such as metal, metal oxide, metal nitride or other suitable materials.

The conductive via 124 (or a top bond pad or a pad) may be disposed within the openings defined by the dielectric layer 122 and surrounded by or around the seed layer 123 and the dielectric layer 122. The conductive via 124 may include conductive materials, such as copper, gold, tin, aluminum, silver, tungsten, nickel, or a combination thereof. In some embodiments, the conductive via 124 may have a grain size different from that of the conductive via 116. In some embodiments, the conductive via 124 of the morphology modifier 120 may be electrically connected to the conductive via 116 of the electronic component 110. In some embodiments, the conductive via 124 of the morphology modifier 120 may be in contact with the conductive via 116 of the electronic component 110. In some embodiments, the conductive via 124 of the morphology modifier 120 may be substantially aligned to the conductive via 116 of the electronic component 110.

In some embodiments, the conductive cap 130 may cover the surface 114s1 of the terminal 114 and extend to the surface 112s1 of the dielectric layer 112. In some embodiments, a portion of the conductive cap 130 may be located cover the surface 112s1 of the dielectric layer 112. In some embodiments, a portion of the conductive cap 130 is located lower than the surface 112s1 of the dielectric layer 112 of the electronic component 110. In some embodiments, the conductive cap 130 is conformally disposed on the surface 114s1 of the terminal 114. In some embodiments, the conductive cap 130 may include a layer 131 and a layer 132 covering the layer 131. In some embodiments, the conductive cap 130 may be formed by at least one electroless plating (e.g., chemical plating) operation.

The layer 131 may be disposed on the terminal 114 of the electronic component 110. The layer 131 may serve as a barrier layer to prevent the material of the layer 132 from diffusing into the terminal 114. In some embodiments, the layer 131 may be in contact with the terminal 114. In some embodiments, the layer 131 may be formed by one or more electroless plating operations. In some embodiments, the layer 131 may be in contact with the surface 112s1 of the dielectric layer 112. In some embodiments, a portion of the layer 131 may be located lower than the surface 112s1 of the dielectric layer 112 in conformal with the concave profile of the surface 114s1 of the terminal 114. The material of the layer 131 may be different from the terminal 114 and the layer 132. The layer 131 may include, for example, nickel, tin, aluminum, silver, tungsten, phosphor or other suitable materials. In some embodiments, the layer 131 may serve as a reinforcement layer, and the layer 131 has a rigidity greater than that of the terminal 114.

The layer 132 may be disposed on the layer 131. The layer 132 may serve as an anti-oxidation layer to prevent the terminal 114 from oxidation. In some embodiments, the layer 132 may be formed by an electroless plating operation such that the layer 132 may cover a surface 131$s$1 (or a side surface) of the layer 131. In some embodiments, the layer 132 may be in contact with the layer 131. In some embodiments, the layer 132 may be in contact with the surface 131$s$1 of the layer 131. In some embodiments, the layer 132 may be in contact with the surface 112$s$1 of the dielectric layer 112. In some embodiments, the layer 132 may be in contact with the electrical connector 141. In some embodiments, the layer 132 may have an uneven thickness. For example, the layer 132 may have a relatively large thickness over an edge of the layer 131 and a relatively small thickness over the center of the layer 131. The material of the layer 132 may be different from the terminal 114. The layer 132 may include, for example, gold, tin, aluminum, silver, tungsten, or other suitable materials. In some embodiments, the layer 132 has a reduction potential greater than that of the terminal 114 to prevent the terminal from oxidation. That is, the electrical potential activity of the layer 132 is less than that of the terminal 114.

Since the conductive cap 130 is formed by an electroless plating operation, the thickness of the morphology modifier 120 may not impose great impact on the sputtering of a continuous seed layer for the subsequent electroplating operation. That is, even the morphology modifier 120 has a relatively great thickness (e.g., 30 μm or more), the formation of the conductive cap 130 may not be affected because no electroplating operation is involved.

Figure 1C:
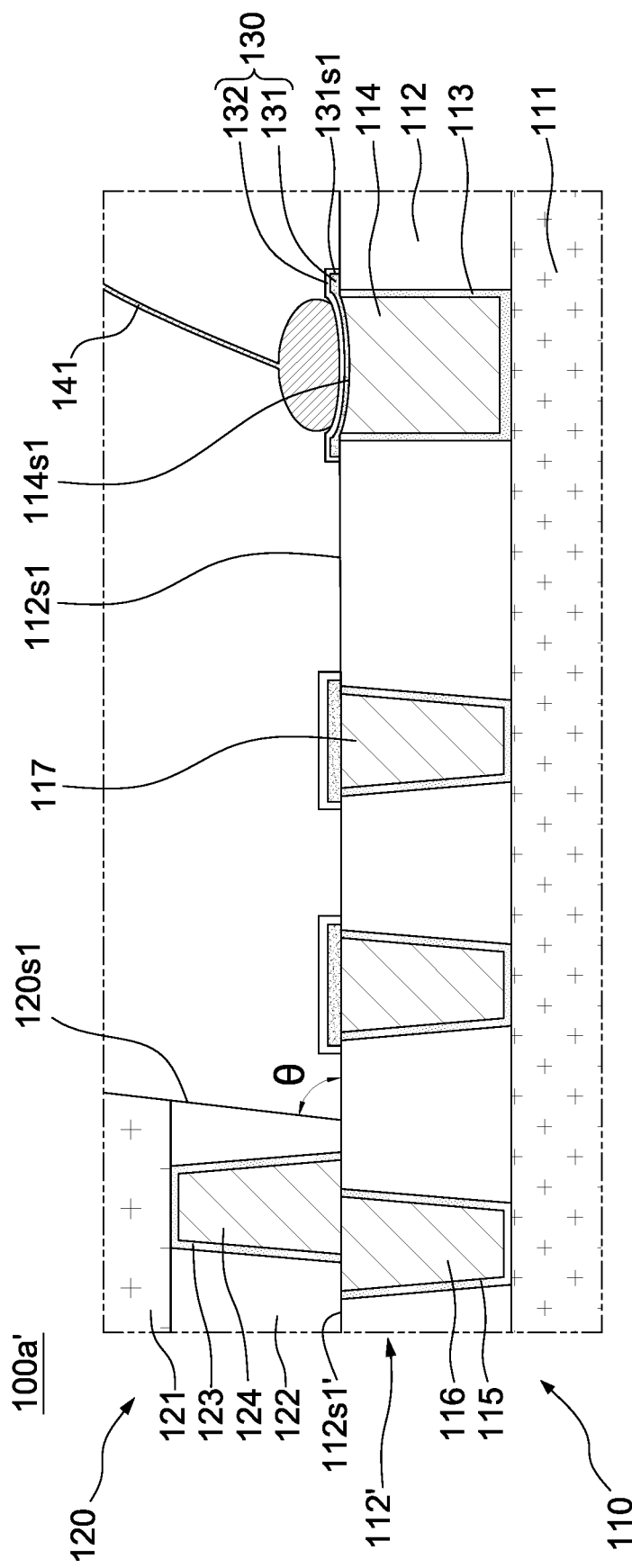
FIG. 1C is a cross-sectional view of an example of an electronic package structure according to some embodiments of the present disclosure.

FIG. 1C is a cross-sectional view of an example of an electronic package structure 100$a$' according to some embodiments of the present disclosure. The electronic package structure 100$a$' of FIG. 1C may have a structure similar to that of the electronic package structure 100$a$ of FIG. 1B except that the conductive via 124 of the morphology modifier 120 may be partially misaligned with the conductive via 116 of the electronic component 110. The misalignment between the morphology modifier 120 (e.g., a smaller upper die) and the electronic component 110 (e.g., a larger bottom die) can be observed in hybrid bonded packages, and the dimensions of the respective conductive vias 124 and 116, respectively, are often designed to tolerate such operational error. As also illustrated in FIG. 1C, the conductive via 116 at the bonding layer of the electronic component 110 and the conductive via 124 at the bonding layer of the morphology modifier 120 may respectively possesses a tapered shape (e.g., tapered toward the active region of the die) so as to facilitate the hybrid bonding alignment operation. The electronic package structure 100$a$' may include a dielectric layer 112' (or a first portion of the dielectric layer) around the conductive via 116. The dielectric layer 112' may have a surface 112$s$1'. In some embodiments, the surface 112$s$1' is substantially coplanar with the surface 112$s$1 of the dielectric layer 112 (or a second portion of the dielectric layer) that around the terminal 114. In some embodiments, the first portion and the second portion of the dielectric layer 112' and 112 is a continuous layer having a planar top surface. In some embodiments, the electronic package structure 100$a$' may include a dummy pad 117. The dummy pad 117 may be disposed between the conductive via 116 and the terminal 114, and may be configured to adjust the roughness of the surface 112$s$1 of the dielectric layer 112.

In some embodiments, the conductive via 124 of the morphology modifier 120 and the conductive via 116 of the electronic component 110 may have an offset. In some embodiments, the conductive via 124 of the morphology modifier 120 may be in contact with the dielectric layer 112 of the electronic component 110. In some embodiments, the seed layer 123 of the morphology modifier 120 may be in contact with the dielectric layer 112 of the electronic component 110. In some embodiments, the dielectric layer 122 of the morphology modifier 120 may be in contact with the conductive via 116 of the electronic component 110. In some embodiments, the dielectric layer 122 of the morphology modifier 120 may be in contact with the seed layer 115 of the electronic component 110. The morphology modifier 120 may have a sidewall 120$s$1. In some embodiments, an included angle θ defined by the sidewall 120$s$1 of the morphology modifier 120 and the surface 112$s$1 of the dielectric layer 112 is less than about 90°.

Figure 2A:
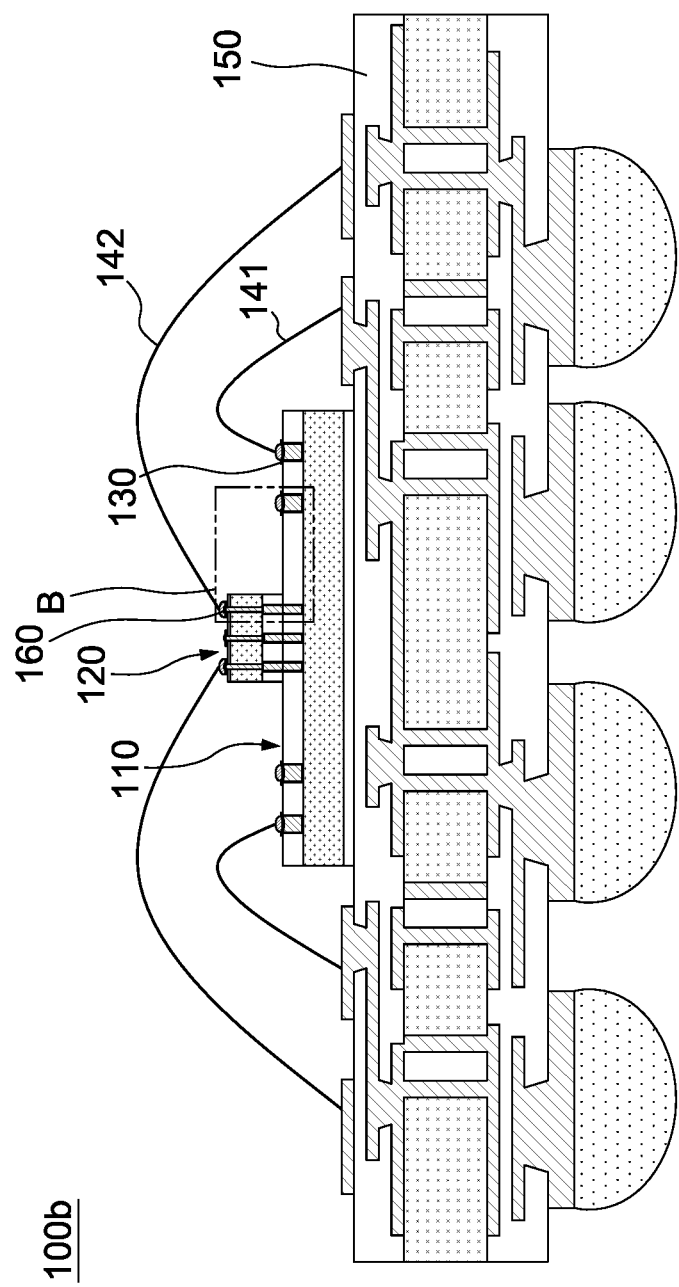
FIG. 2A is a cross-sectional view of an example of an electronic package structure according to some embodiments of the present disclosure.

FIG. 2A is a cross-sectional view of an example of an electronic package structure 100$b$ according to some embodiments of the present disclosure. The electronic package structure 100$b$ of FIG. 2A may have a structure similar to that of the electronic package structure 100$a$ of FIG. 1A except that the electronic package structure 100$b$ may further include electrical connectors 142 and conductive caps 160 associated with the morphology modifier 120 (e.g., the smaller top die). In some embodiments, the electronic package structure 100$b$ is a semiconductor package structure.

The conductive cap 160 may be disposed on the morphology modifier 120. The conductive cap 160 may be configured to electrically connect the morphology modifier 120 and the electrical connector 142, and protect terminals (shown in FIG. 2B) of the morphology modifier 120 from forming undesired side products (such as metal oxide) during a manufacturing process. The material and the structure of the conductive cap 160 may the same as or similar to those of the conductive cap 130.

In some embodiments, the electrical connector 142 may be disposed on the morphology modifier 120. The electrical connector 142 may configured to electrically connect the conductive cap 160 and the carrier 150. In some embodiments, the electrical connector 142 may include a bonding wire. The material of the electrical connector 142 may be the same as or similar to that of the electrical connector 141.

Figure 2B:
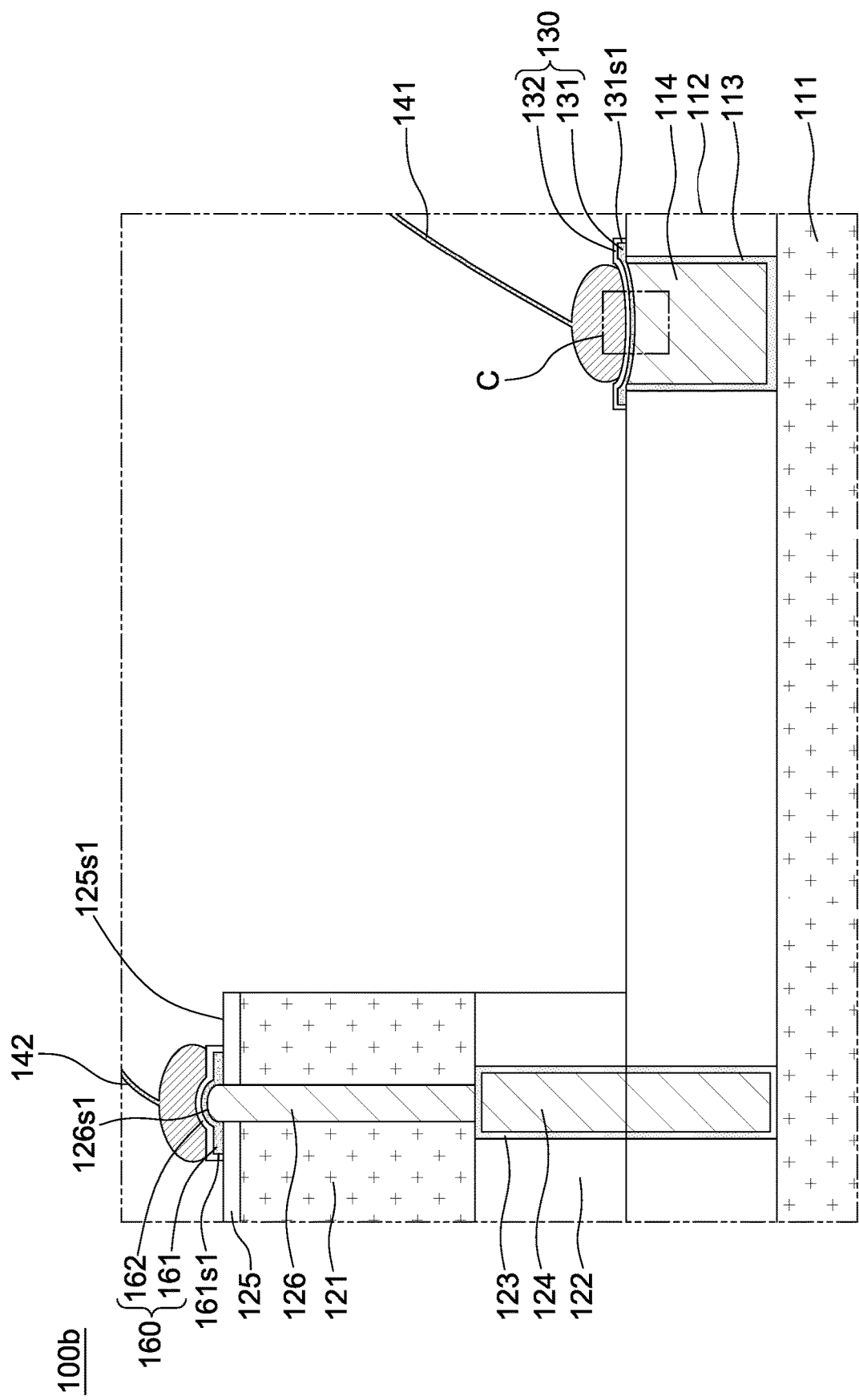
FIG. 2B is an enlarged view of region B of the electronic package structure as shown in FIG. 2A, according to some embodiments of the present disclosure.

FIG. 2B is an enlarged view of region B of the electronic package structure 100$b$ as shown in FIG. 2A, according to some embodiments of the present disclosure.

In some embodiments, the morphology modifier 120 may further include a dielectric layer 125 and a terminal 126. The dielectric layer 125 may be disposed on the substrate 121. The dielectric layer 125 may include oxide, nitride, oxynitride, or other suitable materials. The dielectric layer 125 may define a plurality of openings for accommodating the terminal 126.

In some embodiments, the terminal 126 may penetrate the dielectric layer 125 and the substrate 121. In some embodiments, the terminal 126 may protrude from a surface 125$s$1 (or a top surface) of the dielectric layer 125. The terminal 126 may be surrounded by the dielectric layer 125. The terminal 126 may be surrounded by the substrate 121. The terminal 126 of the morphology modifier 120 may be electrically connected to the electronic component 110 through the conductive via 124 of the morphology modifier 120. The terminal 126 may be electrically connected to the carrier 150 through the electrical connector 142. In some embodiments, the terminal 126 may have a surface 126$s$1 (or a top surface) protruding from the surface 125$s$1 of the dielectric layer 125. The terminal 126 may include a through via structure. In some embodiments, the surface 126$s$1 of the terminal 126 is a convex surface. In some embodiments, the terminal 126 may include conductive materials, such as copper, gold, tin, aluminum, silver, tungsten, nickel, or a combination thereof.

In some embodiments, the conductive cap 160 may cover the terminal 126 of the morphology modifier 120 and extend to the surface 125$s1$ of the dielectric layer 125. In some embodiments, the conductive cap 160 may cover the surface 125$s1$ of the dielectric layer 125. In some embodiments, the conductive cap 160 may include a layer 161 and a layer 162 covering the layer 161. In some embodiments, the conductive cap 160 may be formed by at least one electroless plating operation.

The layer 161 may be disposed on the terminal 126 of the morphology modifier 120. The layer 161 may serve as a barrier layer to prevent the material of the layer 162 from diffusing into the terminal 126. In some embodiments, the layer 161 may be in contact with the terminal 126. In some embodiments, the layer 161 may be formed by one or more electroless plating operations. In some embodiments, the layer 161 may be in contact with the surface 125$s1$ of the dielectric layer 125. The material of the layer 161 may the same as or similar to that of the layer 131.

The layer 162 may be disposed on the layer 161. The layer 162 may serve as an anti-oxidation layer to prevent the terminal 126 from oxidation. In some embodiments, the layer 162 may be formed by an electroless plating operation such that the layer 162 may cover a surface 161$s1$ (or a side surface) of the layer 161. In some embodiments, the layer 162 may be in contact with the surface 161$s1$ of the layer 161. In some embodiments, the layer 162 may be in contact with the surface 125$s1$ of the dielectric layer 125. In some embodiments, the layer 162 may be in contact with the electrical connector 141. The material of the layer 162 may the same as or similar to that of the layer 132.

The conductive cap 160 may protect the terminal 126 of the morphology modifier 120 from oxidation, and thus enhance the bonding capability of the electrical connector 142 in the electronic package structure 100$b$.

Figure 3:
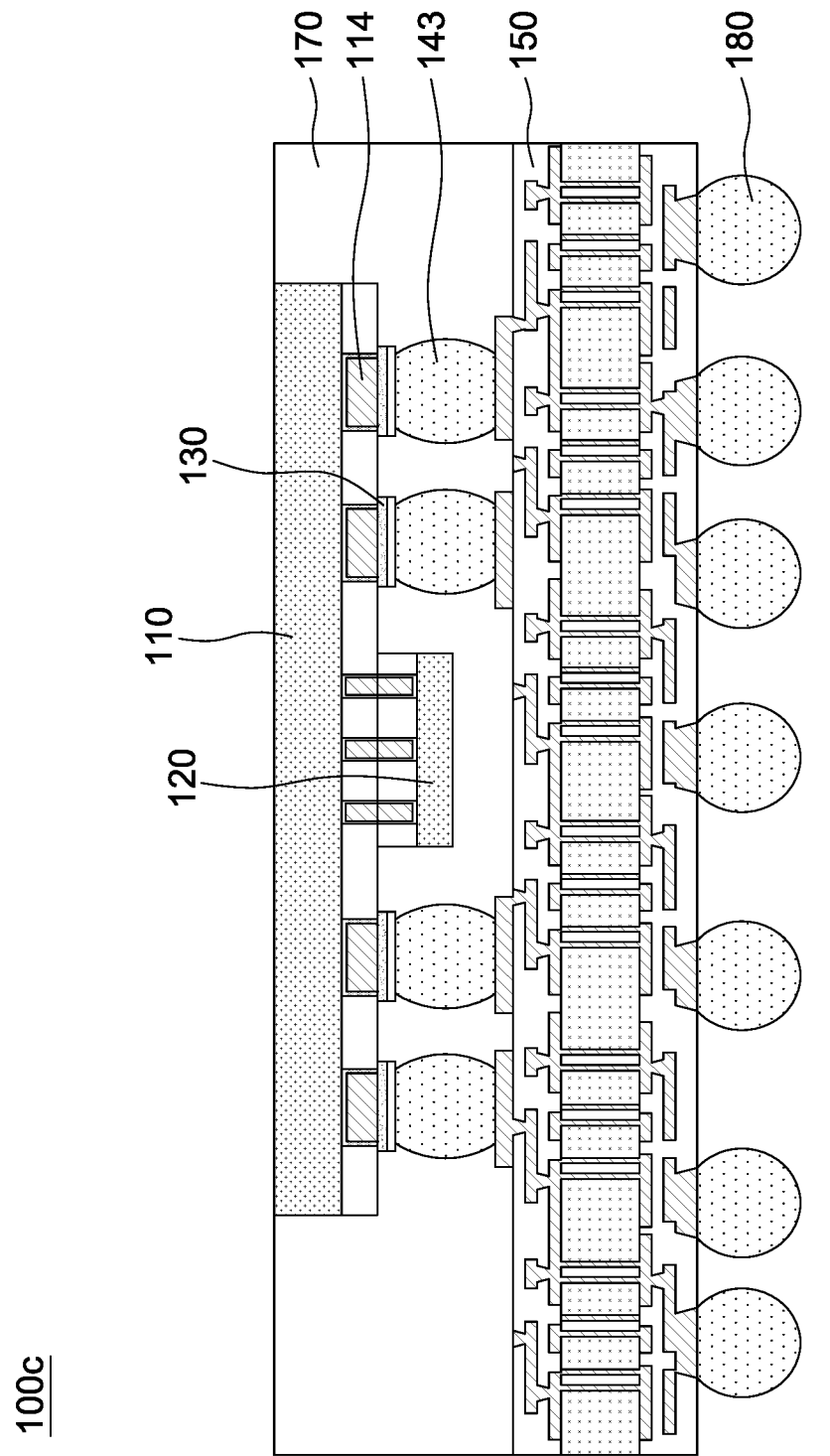
FIG. 3 is a cross-sectional view of an example of an electronic package structure according to some embodiments of the present disclosure.

FIG. 3 is a cross-sectional view of an example of an electronic package structure 100$c$ according to some embodiments of the present disclosure. The electronic package structure 100$c$ of FIG. 3 may have a structure similar to that of the electronic package structure 100$a$ of FIG. 1A except that the electronic package structure 100$c$ may include electrical connectors 143 replacing the electrical connectors 141 of the electronic package structure 100$a$. In some embodiments, the electronic package structure 100$c$ is a semiconductor package structure.

In some embodiments, an active surface of the electronic component 110 may face the carrier 150. In some embodiments, the electrical connector 143 may be disposed between the electronic component 110 and the carrier 150. In some embodiments, the electrical connector 143 may include solder balls. As previously described, the electronic package structure 100$c$ also include a conductive cap 130 covering the surface of the terminals 114.

In some embodiments, the electronic package structure 100$c$ may include an encapsulant 170. The encapsulant 170 may encapsulate the electronic component 110, the morphology modifier 120 and the electrical connectors 143.

In some embodiments, the electronic package structure 100$c$ may include electrical connectors 180. The electrical connectors 180 may be disposed on the carrier 150 and on a side opposite to the electrical connector 143. The electrical connector 180 may include solder balls.

Figure 4:
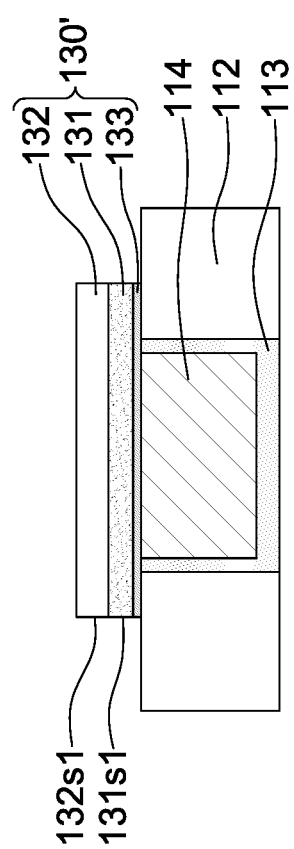
FIG. 4 is a cross-sectional view of an example of a terminal and conductive cap according to some embodiments of the present disclosure.

FIG. 4 is a cross-sectional view of an example of an terminal 114 and a conductive cap 130' according to some embodiments of the present disclosure. In some embodiments, the conductive cap 130' may be formed by a sputtering operation, an electroplating operation, and a photolithography operation. In some embodiments, the conductive cap 130' may further include a seed layer 133. The seed layer 133 may be disposed on the terminal 114. The seed layer 133 may be in contact with the seed layer 113 and the terminal 114 and a portion of the dielectric layer 112. The seed layer 133 may be disposed between the layer 131 and the terminal 114. The seed layer 133 may be formed by a sputtering operation. A photosensitive layer (not shown) may be formed on the seed layer 133 and patterned to define openings. Then, the layer 131 may be electroplated on the partially masked seed layer 133 and within the openings of the photosensitive layer. Next, the layer 132 may be electroplated on the layer 131 and within the openings of the photosensitive layer. The photosensitive layer and a portion of the seed layer 133 not covering the terminal may be removed to produce the conductive cap 130'. The surface 131$s1$ of the layer 131 may be substantially coplanar with a layer 132$s1$ (or a side surface) of the layer 132.

Figure 5B:
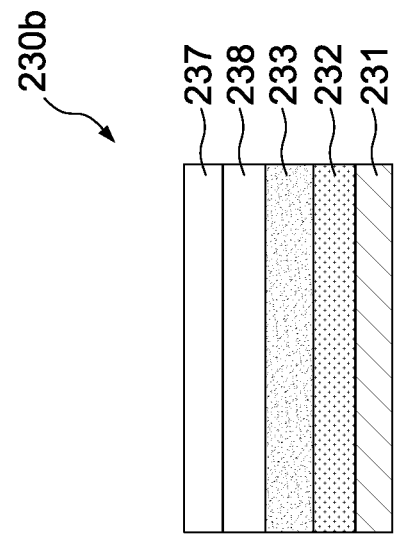
FIG. 5B an enlarged view of region C of the electronic package structure as shown in FIG. 2B, according to some embodiments of the present disclosure.
Figure 5A:
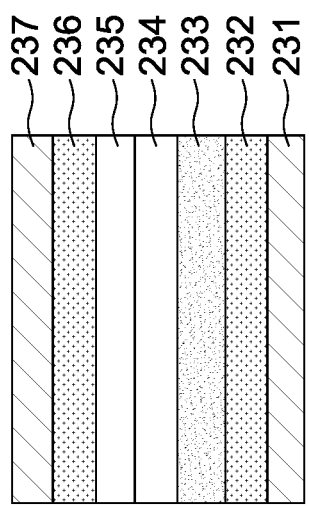
FIG. 5A an enlarged view of region C of the electronic package structure as shown in FIG. 2B, according to some embodiments of the present disclosure.

FIG. 5A is an enlarged view of region C of the electronic package structure 100$b$ as shown in FIG. 2B, according to some embodiments of the present disclosure. Referring to FIG. 2B and FIG. 5A, the conductive structure 230$a$ may include the conductive cap 130, the terminal 114, and a portion of the electrical connector 141. In some embodiments, the conductive layer 231 may correspond to a portion of the terminal 114 (e.g., copper). The conductive layer 233 may correspond to a portion of the layer 131 (e.g., nickel and phosphor, or phosphor-doped nickel). The conductive layer 235 may correspond to a portion of the layer 132 (e.g., gold). The conductive layer 237 may correspond to a portion of the electrical connector 141 (e.g., copper wire).

Accordingly, a conductive layer 232 identified between the conductive layers 231 and 233 may include the solid solution of copper and nickel, a conductive layer 234 identified between the conductive layers 233 and 235 may include the solid solution of nickel and gold, a conductive layer 236 identified between the conductive layers 235 and 237 may include the solid solution of copper and gold.

FIG. 5B is an enlarged view of region C of the electronic package structure 100$b$ as shown in FIG. 2B, according to some embodiments of the present disclosure. Referring to FIG. 2B and FIG. 5B, the conductive structure 230$b$ may include the conductive cap 130, the terminal 114, and a portion of the electrical connector 141. In some embodiments, the conductive layer 231 may correspond to a portion of the terminal 114 (e.g., copper). The conductive layer 233 may correspond to a portion of the layer 131 (e.g., nickel). The conductive layer 237 may correspond to a portion of the electrical connector 141 (e.g., gold wire). Accordingly, a conductive layer 232 identified between the conductive layers 231 and 233 may include the solid solution of copper and nickel, a conductive layer 238 identified between the conductive layers 233 and 237 may include the solid solution of nickel and gold.

FIG. 6A, FIG. 6B, FIG. 6C, and FIG. 6D illustrate various stages of an example of a method for manufacturing an electronic package structure 100$a$ according to some embodiments of the present disclosure.

Figure 6A:
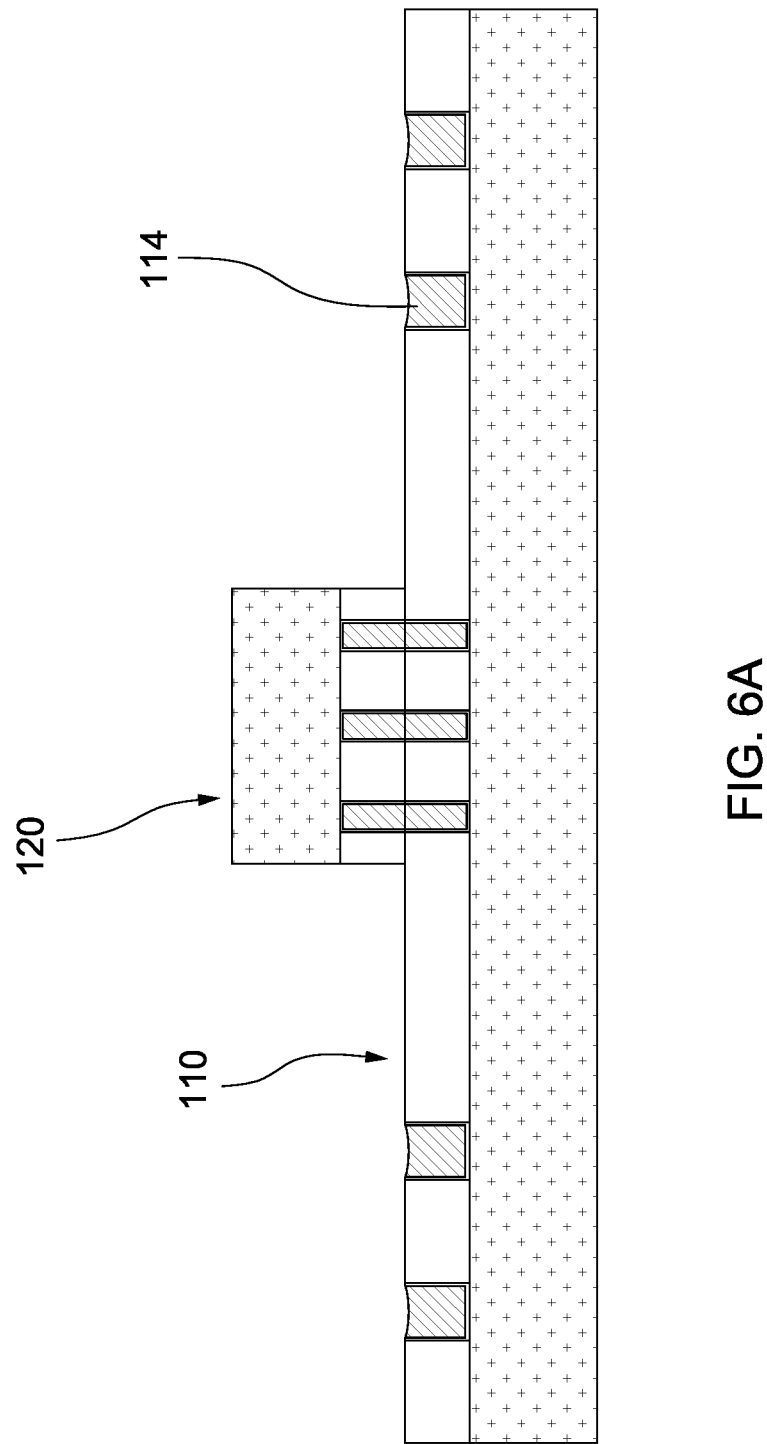
FIG. 6A, FIG. 6B, FIG. 6C, and FIG. 6D illustrate various stages of an example of a method for manufacturing an electronic package structure according to some embodiments of the present disclosure.

Referring to FIG. 6A, an electronic structure is provided. The electronic structure may include an electronic component 110 and a morphology modifier 120. In some embodiments, the morphology modifier 120 is hybrid bonded to the electronic component 110. The electronic component 110 may have a terminal 114 exposed from the morphology modifier 120. In some embodiments, a surface-treating operation is performed on the terminal 114 and the conductive via 116. In some embodiments, a chemical mechanical polishing (CMP) operation is performed on the hybrid bonding surface of the electronic component 110 prior to the hybrid bonding, terminal 114 of the electronic component 110 may result in a concave surface due to the CMP slurry may have different removal rates to the terminal 114 and the dielectric layer 112. The CMP operation may include planarizing the dielectric layer 112, the terminal 114 and the conductive via 116. The morphology modifier 120 may have a thickness greater than 30 μm.

Figure 6B:
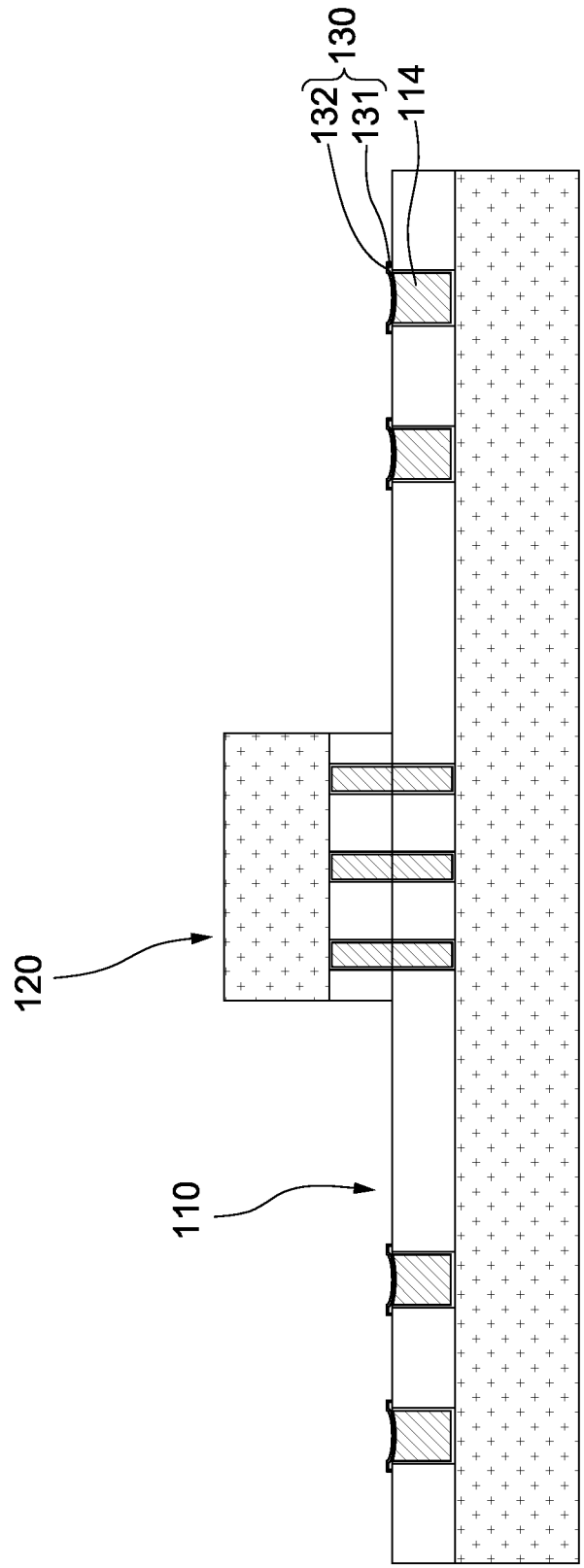

Referring to FIG. 6B, a conductive cap 130 may be formed to cover the terminal 114 of the electronic component 110. The conductive cap 130 may have a layer 131 and a layer 132 covering the layer 131. In some embodiments, the layer 131 may be formed by an electroless plating (e.g., chemical plating) operation. The layer 131 extends from the surface of the terminal 114 to the nearby surface of the dielectric layer 112. Depending on the plating parameters adopted in the electroless plating operation, the lateral extension of the layer 131 can be controlled. In some embodiments, the layer 132 may be formed by a subsequent electroless plating operation such that the layer 132 may cover both the top surface and the side surface of the layer 131.

Figure 6C:
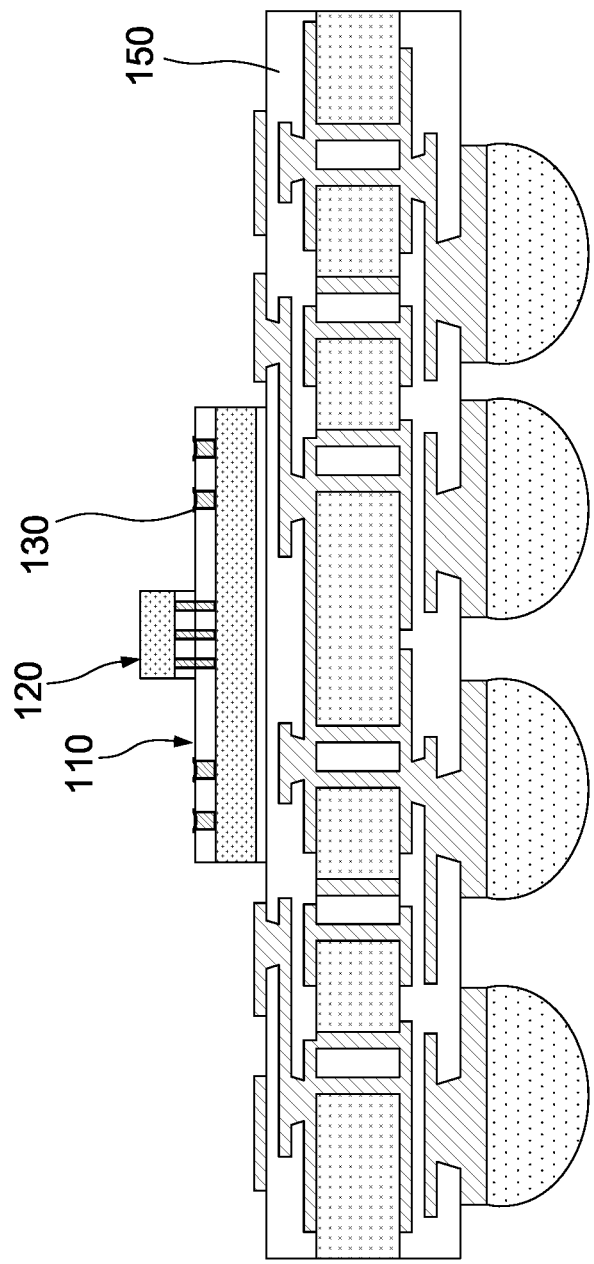

Referring to FIG. 6C, a carrier 150 is provided. The electronic structure including the electronic component 110 and the morphology modifier 120 is disposed on the carrier 150. In some embodiments, the electronic component 110 may be attached to the carrier 150 through a die attach film that binds the backside surface of the electronic component 110 and the carrier 150.

Figure 6D:
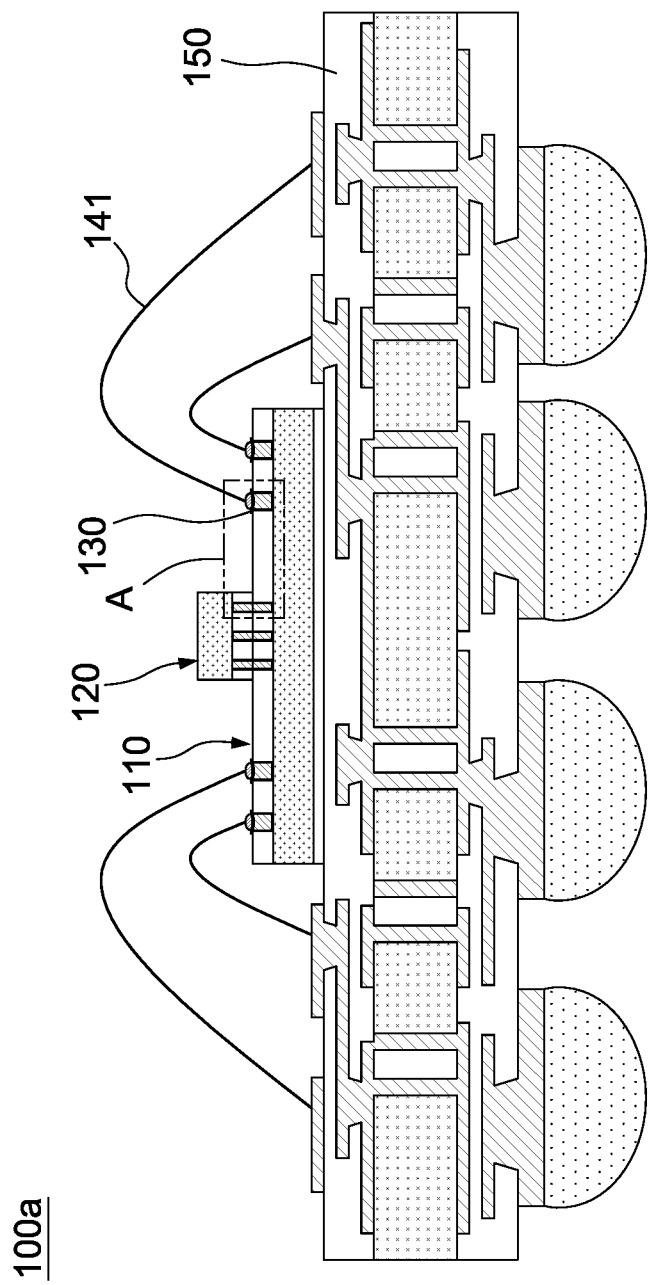

Referring to FIG. 6D, an electrical connector 141 (e.g., bonding wires) is formed to connect the conductive cap 130 and the carrier 150, and an electronic package structure 100a is produced. Since the conductive cap 130 described in the present disclosure is formed prior to the formation of the electrical connector 141, and the surface of the conductive cap 130 may be composed of noble metal such as gold, therefore the wire-bonding surface can be substantially free of oxides prior to wire bonding, and enhancing the bonding capability of the terminal 114 on the electronic component 110.

In a comparative example, the conductive cap 130 is formed by electroplating operation and a photolithography operation. A seed layer may be formed on the electronic component 110 and the morphology modifier 120. Then, a photosensitive layer may be formed on the electronic component 110 and the morphology modifier 120, and then be patterned by a photolithography operation. Next, the conductive cap 130 is formed on the seed layer by an electroplating operation. Since the morphology modifier 120 has a relatively large thickness (e.g., 30 μm or more), the seed layer may occur break at the corner defined by the electronic component 110 and the morphology modifier 120, resulting in fail of the electroplating operation. Further, such a large thickness of the morphology modifier 120 may cause a relative great aspect ratio of openings of the patterned photosensitive layer, which may remain residue of the photosensitive layer on the seed layer and thus lead to a failure in forming the conductive cap 130. In the embodiments of the present disclosure, an electroless plating operation is performed, and it does not need to form a seed layer first. Further, a photolithography operation can also be omitted. Therefore, the aforementioned problems of the comparative example can be solved.

FIG. 7A, FIG. 7B, FIG. 7C, FIG. 7D, FIG. 7E, FIG. 7F, FIG. 7G, FIG. 7H and FIG. 7I illustrate various stages of an example of a method for manufacturing an electronic package structure 100b according to some embodiments of the present disclosure.

Referring to FIG. 7A, an electronic structure 120' is provided on a carrier 191. The electronic structure 120' may include a wafer, a panel, or a strip. The electronic structure 120' may include repeating units of semiconductor dies or electronic dies. As shown in FIG. 7A, the electronic structure 120' may include a substrate 121, a dielectric layer 122, a seed layer 123, a conductive via 124 serving as a hybrid bonding pad, and a terminal 126 subsequently serving as through via. In some embodiments, the terminal 126 is embedded in the substrate 121 prior to a chemical mechanical polishing (CMP) operation illustrated in FIG. 7B.

Referring to FIG. 7B, a first CMP operation may be performed on the semiconductor substrate 121, and the terminal 126 is exposed from the substrate 121 to an extent that slightly protruding from the substrate 121.

Figure 7C:
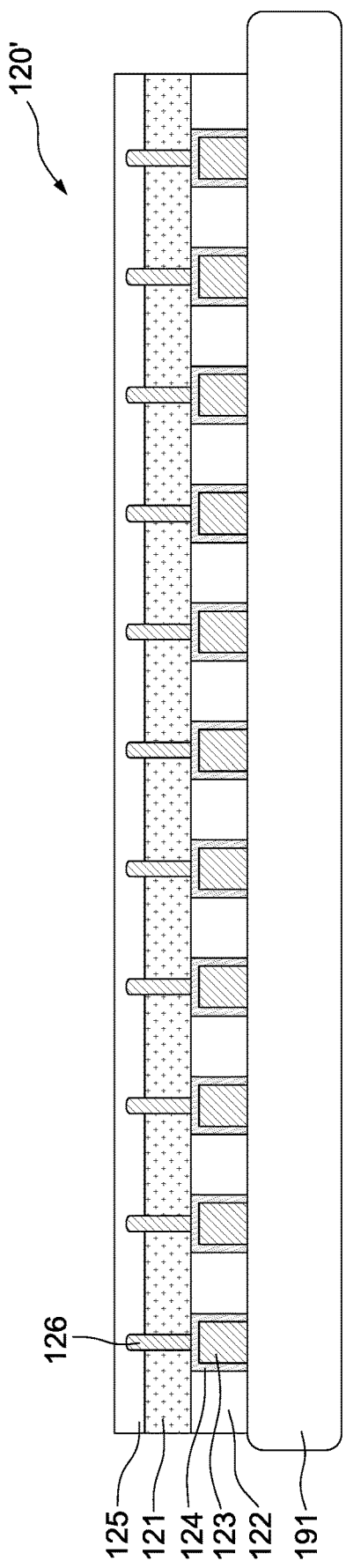

Referring to FIG. 7C, a dielectric layer 125 is formed on the substrate 121 and covering the protruded portion of the terminal 126. The dielectric layer 125 may be formed by, for example, a chemical vapor deposition (CVD) process.

Figure 7D:
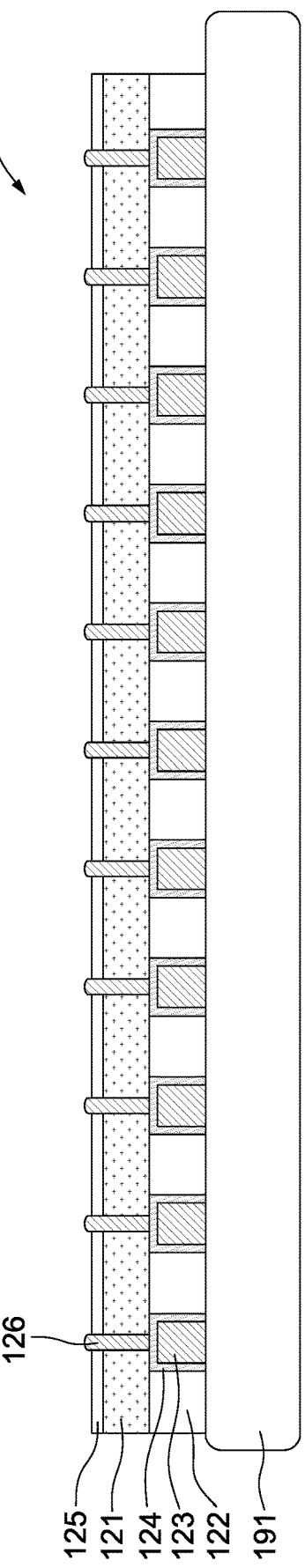

Referring to FIG. 7D, a second CMP operation may be performed on the dielectric layer 125, and a portion of the terminal 126 may again be exposed from the dielectric layer 125 to an extent slightly protruding from the dielectric layer 125.

Figure 7E:
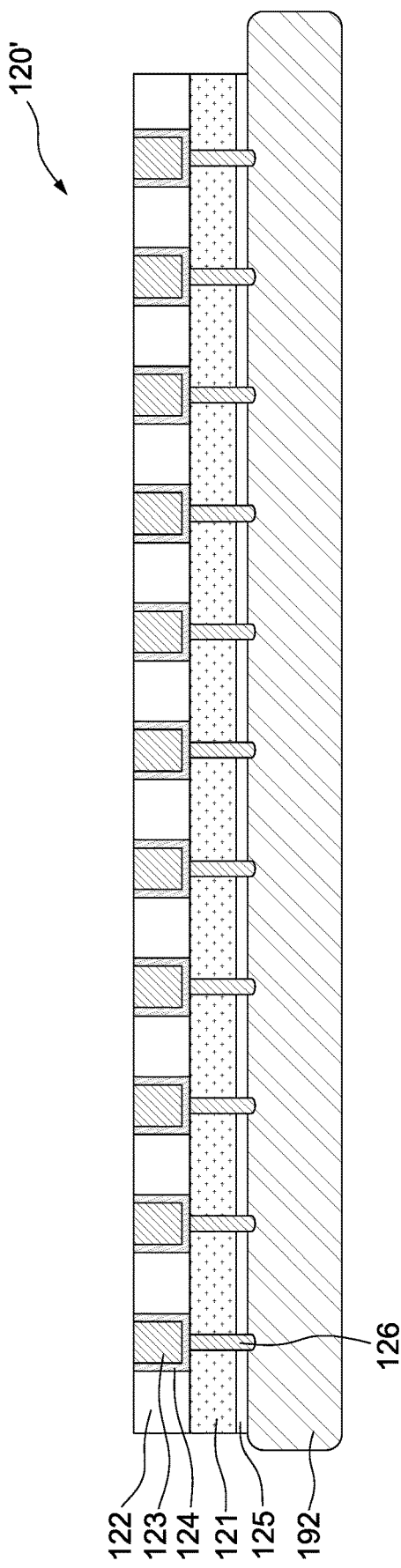

Referring to FIG. 7E, the carrier 191 may be removed, and the electronic structure 120' may be flipped and disposed on a deformable carrier 192. The dielectric layer 125 and the exposed portion of the terminal 126 may be in contact with the deformable carrier 192. A surface treatment, such as a cleaning operation, may be performed on the dielectric layer 122 and the terminal 124 as a preparation to the subsequent hybrid bonding operation.

Figure 7F:
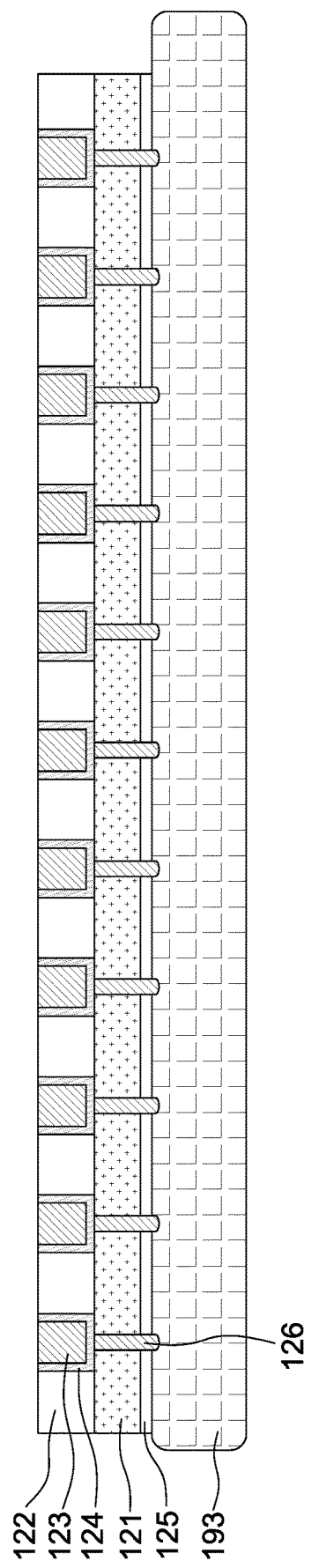

Referring to FIG. 7F, the electronic structure 120' may be transferred to a tape 193 for dicing operation. The dielectric layer 125 and the terminal 126 may be in contact with the tape 193.

Figure 7G:
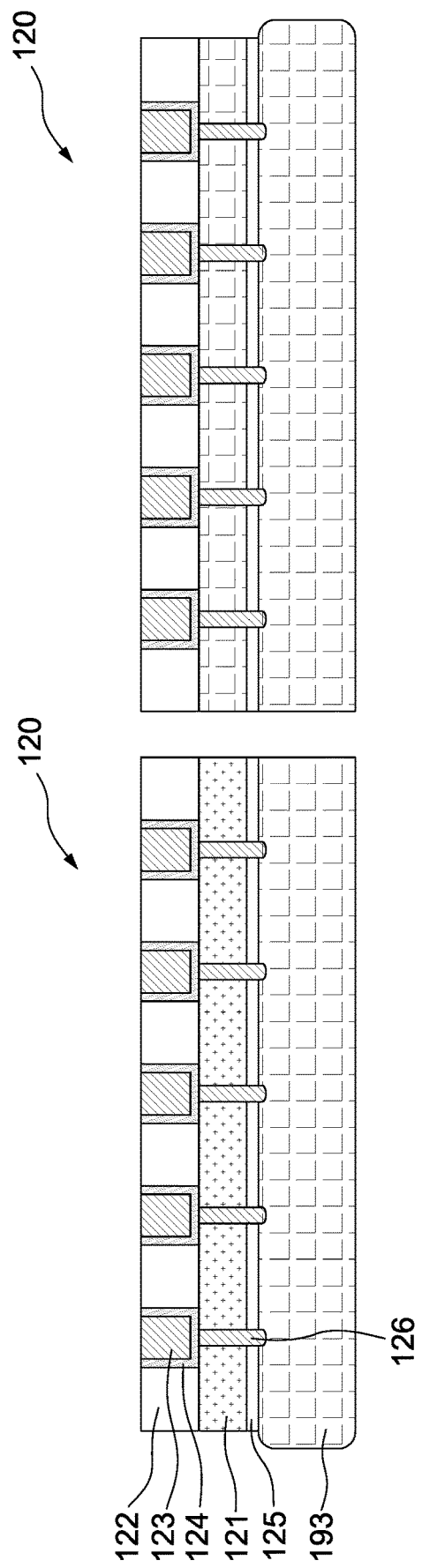

Referring to FIG. 7G, the electronic structure 120' is diced, and a plurality of semiconductor dies or electronic dies can be obtained to serve as the morphology modifiers 120 in the electronic packages described herein.

Figure 7H:
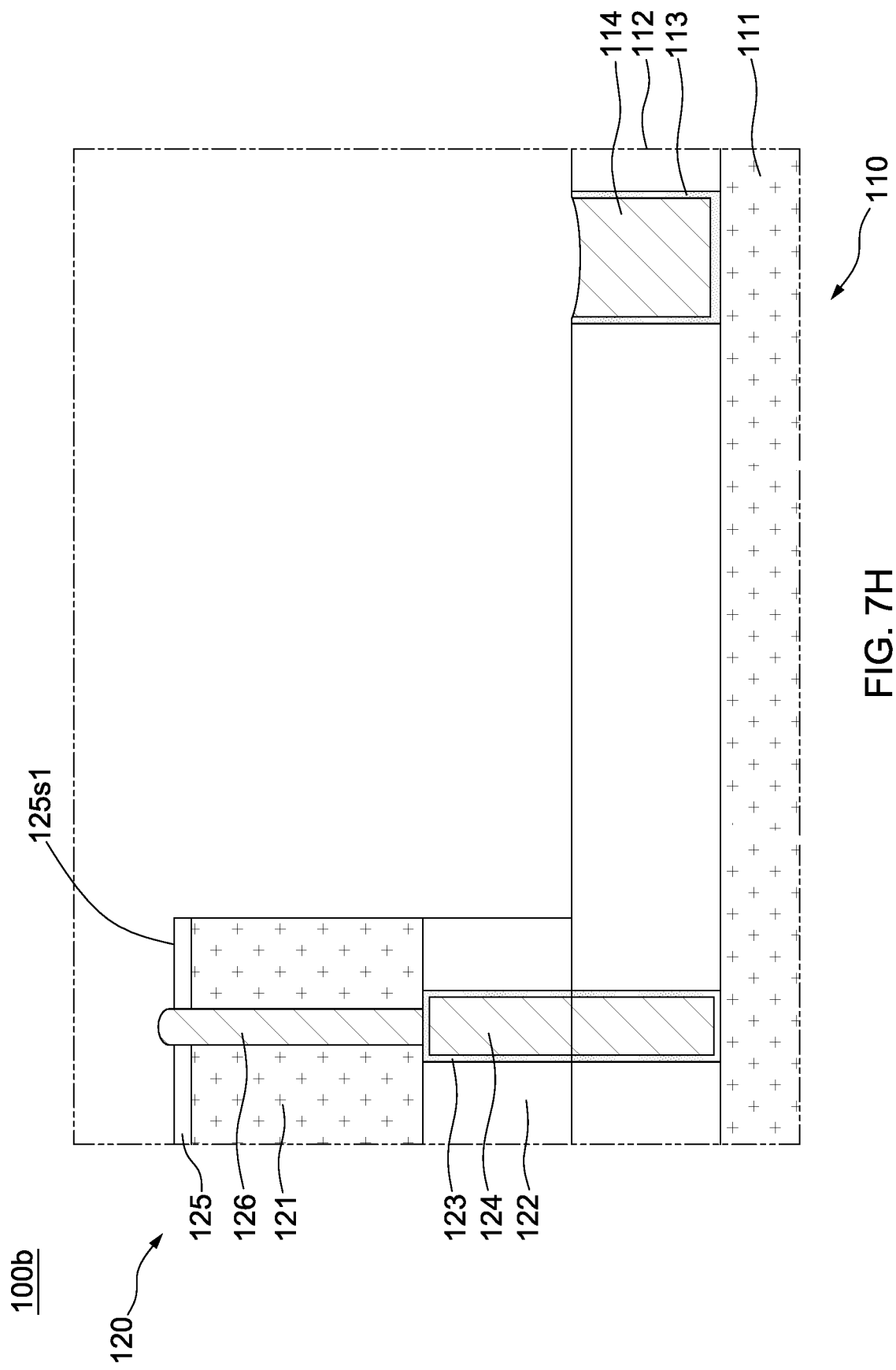

Referring to FIG. 7H, the morphology modifier 120 is boned to the electronic component 110 through a hybrid bonding operation. The terminal 126 is exposed from a surface 125s1 of the dielectric layer 125.

Figure 7I:
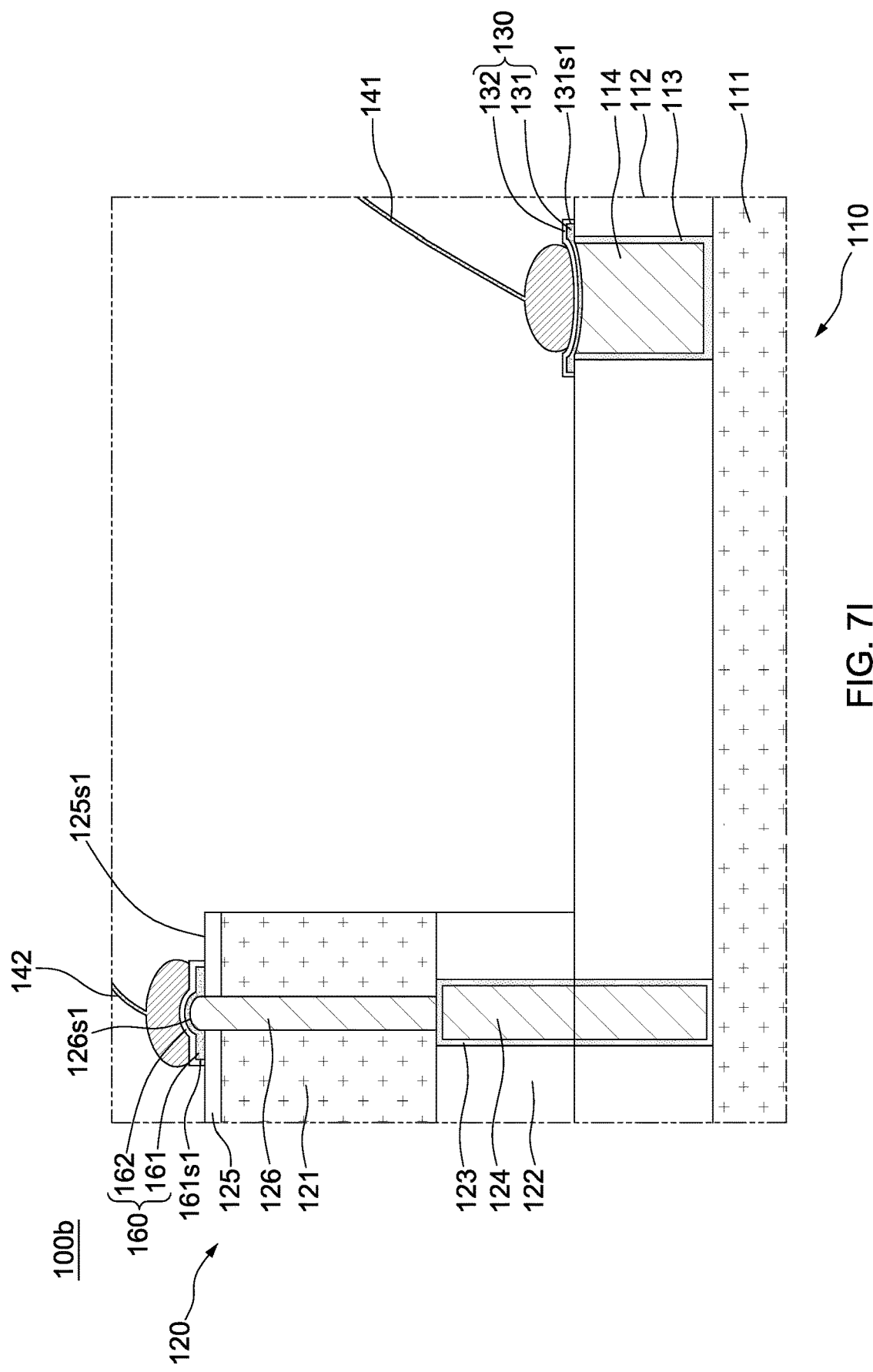

Referring to FIG. 7I, conductive caps 130 and 160 are formed to cover the terminals 113 and 126, respectively, and electrical connectors 141 and 142 (e.g., bonding wires) are formed on the conductive caps 130 and 160, respectively. The conductive cap 160 may include layers 161 and 162. The processes for forming the layers 161 and 162 may be the same as or similar to those of the layers 131 and 132, respectively. Since the conductive cap 160 described in the present disclosure is formed prior to the formation of the electrical connector 142, and the surface of the conductive cap 160 may be composed of noble metal such as gold, therefore the wire-bonding surface can be substantially free of oxides prior to wire bonding, and enhancing the bonding capability of the terminal 126 on the morphology modifiers 120.

FIG. 8A, FIG. 8B, FIG. 8C and FIG. 8D illustrate various stages of an example of a method for manufacturing an electronic package structure 100c according to some embodiments of the present disclosure.

Figure 8A:
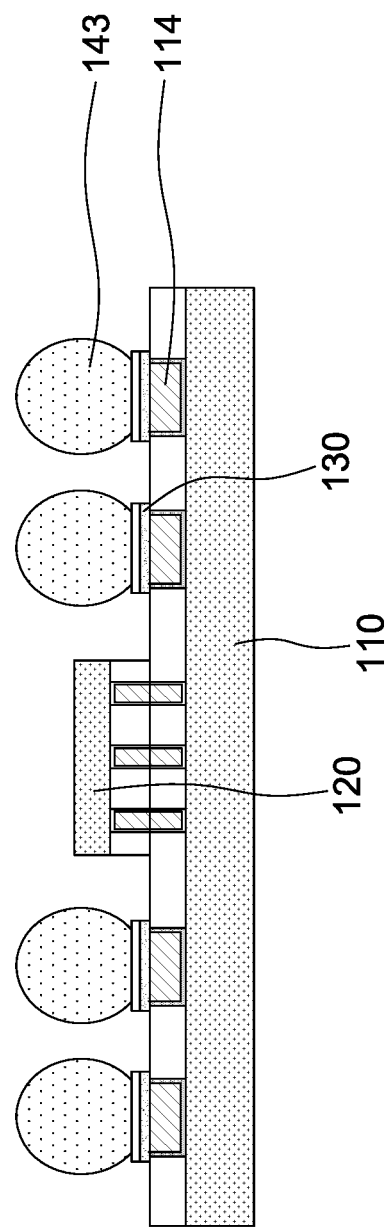
FIG. 8A, FIG. 8B, FIG. 8C and FIG. 8D illustrate various stages of an example of a method for manufacturing an electronic package structure according to some embodiments of the present disclosure.

Referring to FIG. 8A, an electronic structure is provided. The electronic structure may include an electronic component 110 and a morphology modifier 120. In some embodiments, the morphology modifier 120 is hybrid bonded to the electronic component 110. The electronic component 110 may have a terminal 114 exposed from the morphology modifier 120. In some embodiments, a conductive cap 130 may cover the terminal 114 of the electronic component 110. In some embodiments, an electrical connector 143 is formed on the conductive cap 130.

Figure 8B:
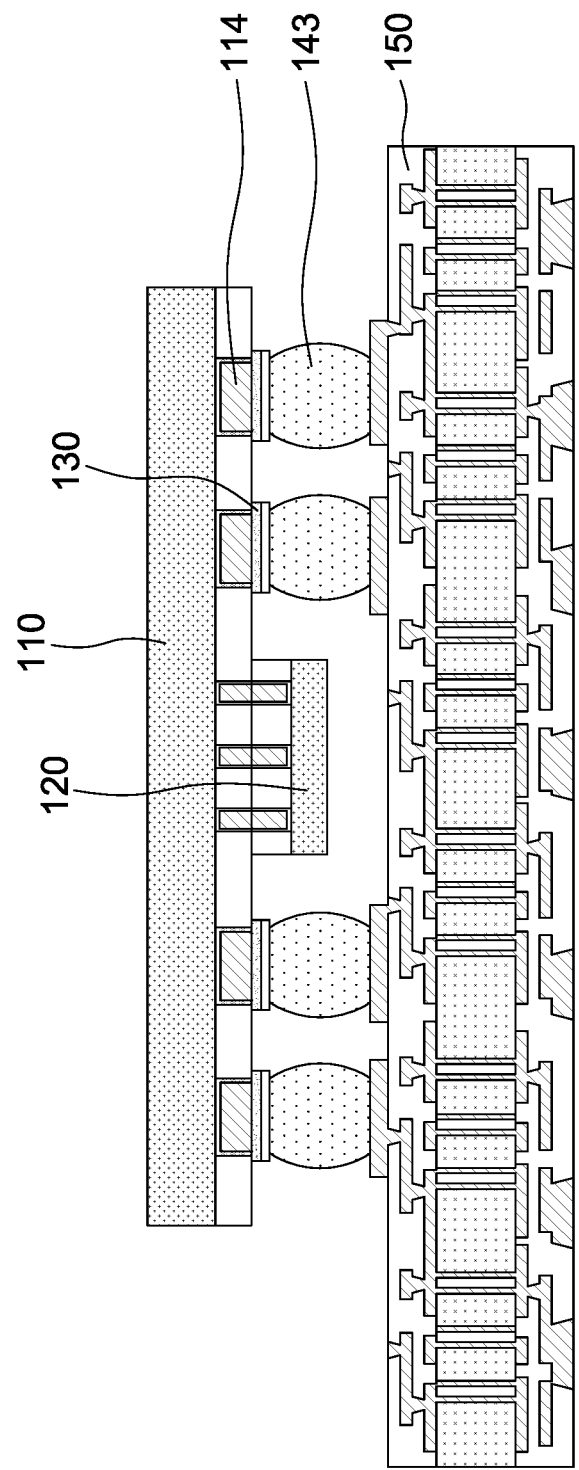

Referring to FIG. 8B, a carrier 150 is provided. The electronic structure may be disposed on the carrier 150 through the electrical connector 143.

Figure 8C:
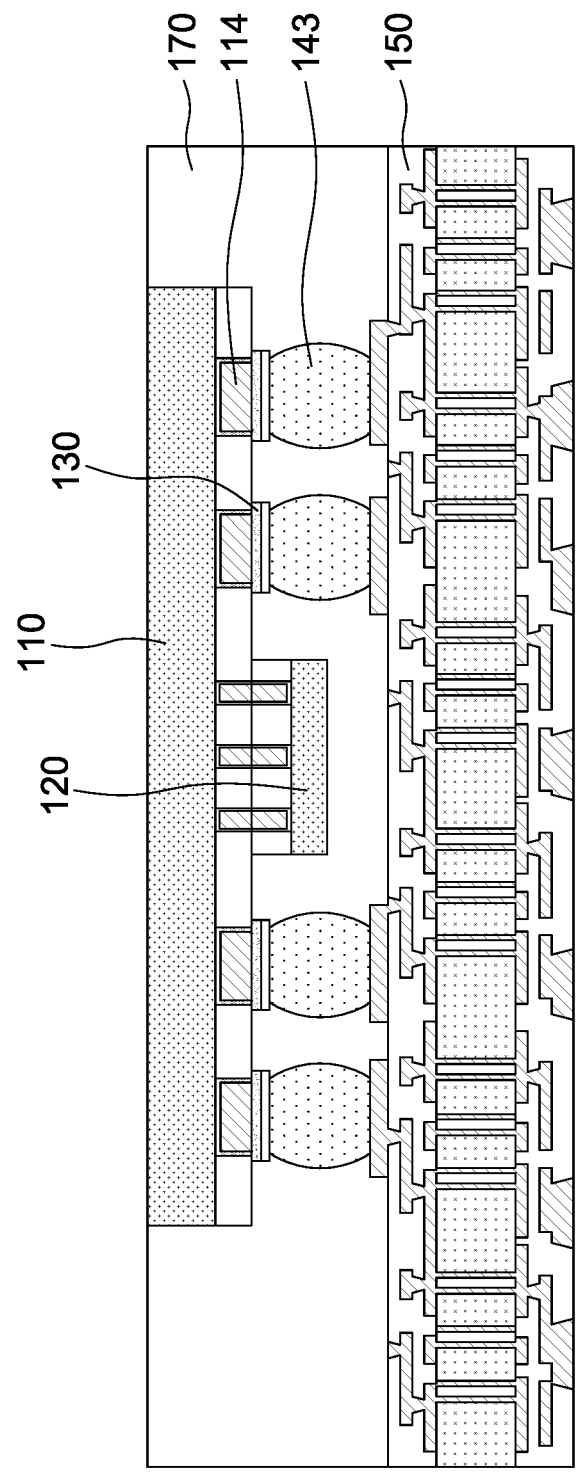

Referring to FIG. 8C, an encapsulant 170 may be formed on the carrier 150 to encapsulate the electronic component 110, the morphology modifier 120 and the electrical connectors 143.

Figure 8D:
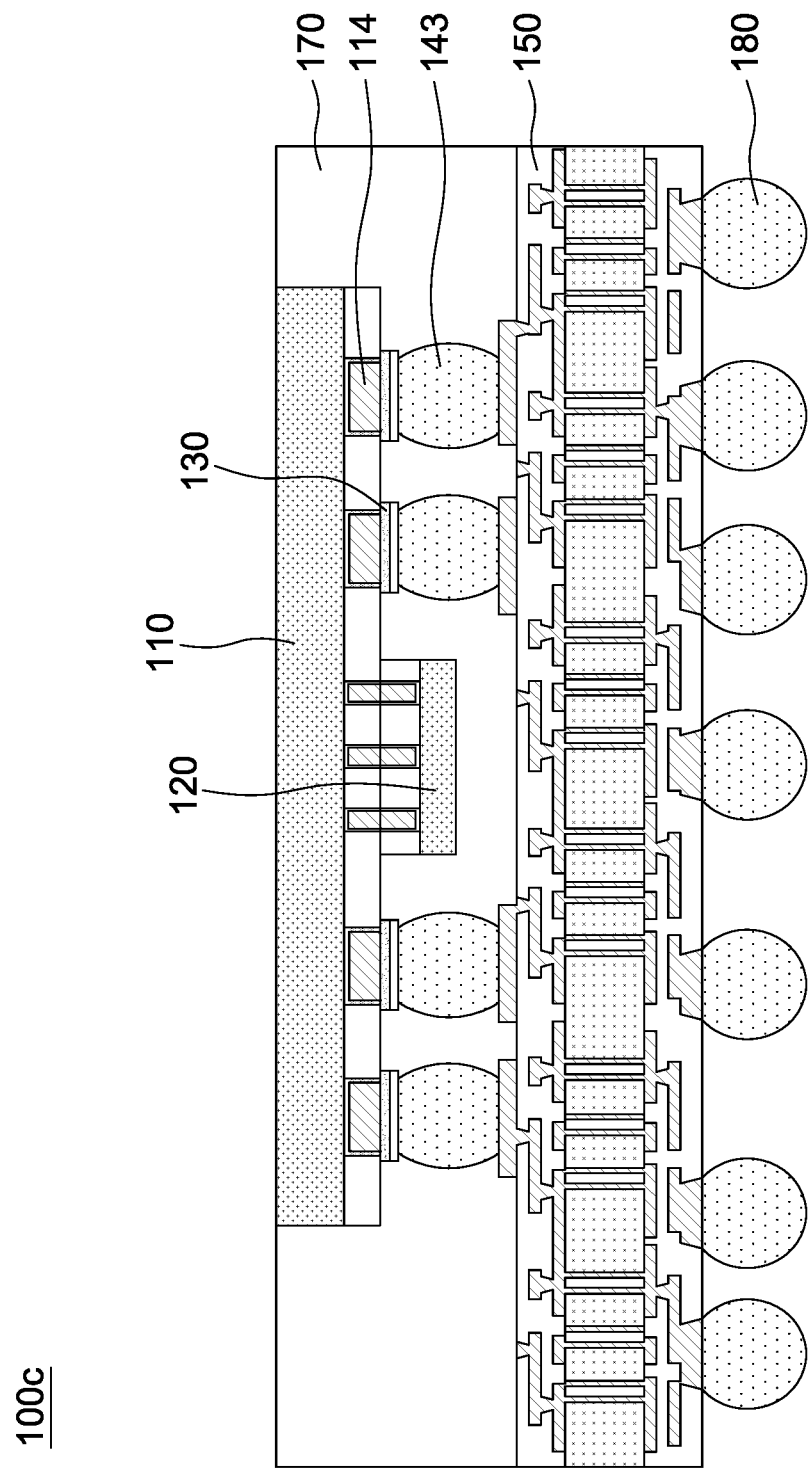

Referring to FIG. 8D, electrical connectors 180 may be formed on the carrier 150, and an electronic package structure 100c is produced.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package structure, comprising:
 a carrier comprising:
  a pad at a side of the carrier and configured to electrically connect an exterior circuit and
  a dielectric layer around the pad; and
  a protection layer on the pad and covering the pad and the dielectric layer; and
 a component disposed on the side of the carrier,
 wherein a top surface of the component is higher than a top surface of the pad, the protection layer comprises a first layer and a second layer disposed on the first layer, and wherein the second layer covers a sidewall of the first layer, and wherein the second layer comprises an anti-oxidation layer.

2. The electronic package structure of claim 1, wherein the protection layer comprises a barrier layer.

3. The electronic package structure of claim 2, wherein the pad electrically connects the exterior circuit via a solder.

4. The electronic package structure of claim 1, wherein the protection layer comprises a reinforcement layer.

5. The electronic package structure of claim 4, wherein the pad electrically connect the exterior circuit via a bonding wire.

6. The electronic package structure of claim 1, wherein an included angle defined by a sidewall of the component and a top surface of the dielectric layer is less than about 90°.

* * * * *